(12) United States Patent
Miller

(10) Patent No.: US 7,498,523 B2
(45) Date of Patent: Mar. 3, 2009

(54) DIRECT WIRE ATTACH

(75) Inventor: William A. Miller, Camas, WA (US)

(73) Assignee: Efficere Inc., Vancouver, WA (US)

( * ) Notice: Subject to any disclaimer, the term of this patent is extended or adjusted under 35 U.S.C. 154(b) by 102 days.

(21) Appl. No.: 11/348,581

(22) Filed: Feb. 6, 2006

(65) Prior Publication Data
US 2007/0181337 A1 Aug. 9, 2007

(51) Int. Cl.
*H01R 12/04* (2006.01)
*H05K 1/11* (2006.01)
(52) U.S. Cl. .................. 174/261; 29/842; 361/777
(58) Field of Classification Search ......... 174/261–266; 29/842, 845; 361/777–779
See application file for complete search history.

(56) References Cited

U.S. PATENT DOCUMENTS

| | | | |
|---|---|---|---|
| 4,906,953 A * | 3/1990 | Li et al. ..................... 333/33 |
| 5,404,117 A | 4/1995 | Walz | |
| 5,517,747 A * | 5/1996 | Pierro et al. .................. 29/600 |
| 5,755,596 A * | 5/1998 | Watson ........................ 439/608 |
| 5,764,489 A | 6/1998 | Leigh et al. | |
| 5,828,555 A * | 10/1998 | Itoh .......................... 361/784 |
| 6,575,762 B2 * | 6/2003 | Evans ........................ 439/63 |
| 6,639,154 B1 * | 10/2003 | Cartier et al. ............... 174/255 |
| 6,873,513 B2 * | 3/2005 | Anthony ..................... 361/118 |
| 6,878,901 B2 | 4/2005 | Johnson et al. | |
| 6,880,241 B2 | 4/2005 | Edwardsen et al. | |
| 6,980,068 B2 | 12/2005 | Miyazawa et al. | |
| 6,989,492 B2 * | 1/2006 | Nightingale ................. 174/100 |
| 2003/0073328 A1 * | 4/2003 | Driscoll et al. ................ 439/65 |

* cited by examiner

*Primary Examiner*—Jeremy C Norris
(74) *Attorney, Agent, or Firm*—Marger Johnson & McCollom, P.C.

(57) ABSTRACT

An assembly has a conductive trace on a substrate and at least one conductor electrically coupled to the trace. First and second gaps arranged such that one gap is on either side the trace, allowing control of electrical characteristics of a signal path formed of the conductor and the trace.

19 Claims, 5 Drawing Sheets

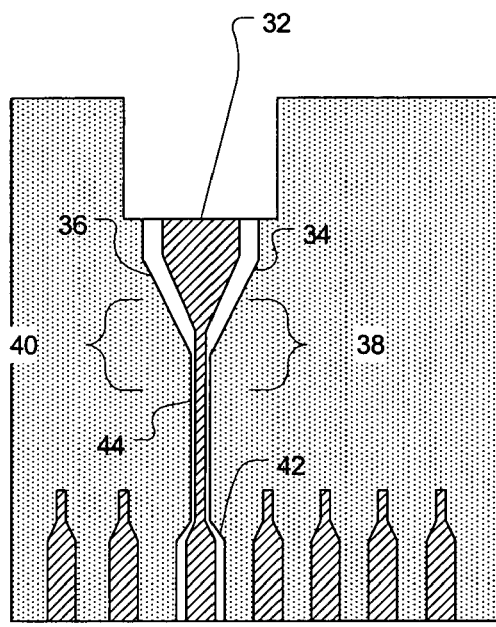
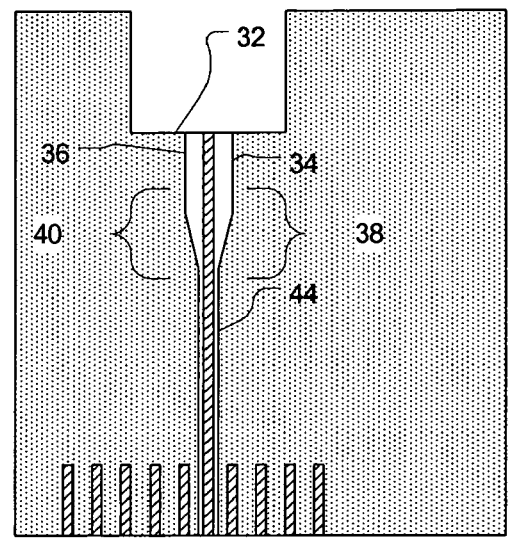
Figure 6a
Figure 6b
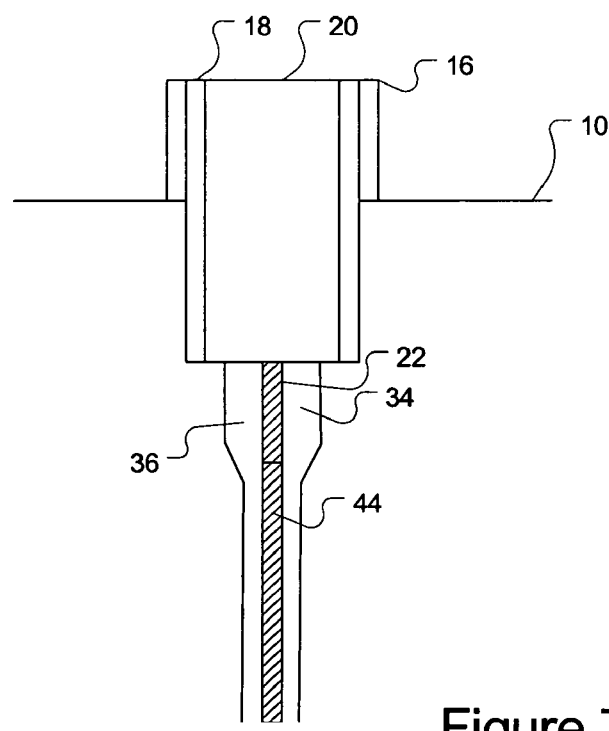
Figure 7

DIRECT WIRE ATTACH

BACKGROUND

When mating two conductors of electricity, impedance and other parameters may become mismatched due to the transitions from one conductor to the other, as well as characteristics that vary between the conductors. Parameter mismatch may lead to signal degradation and losses, resulting in a lower quality signal path than desired. This may impact the speed and performance of electrical circuits.

An example of such a mismatch occurs when a conductor in a cable, such as a co-axial or twinaxial cable, connects to a printed circuit board trace. As the signal travels the signal path, the path characteristics of the conductor may vary as the path travels a portion of the cable that has a jacket and shield, to a portion that just has the shield, to a portion of the cable that lies bare. Further transitions occur when the conductor bends to connect to the trace on the PCB. All of these transitions may result in a characteristic mismatch that in turn has an effect on signal quality.

BRIEF DESCRIPTION OF THE DRAWINGS

Embodiments of the invention may be best understood by reading the disclosure with reference to the drawings, wherein:

FIGS. 6a and 6b show top views of alternative embodiments of a substrate prepared for direct wire attach.

FIG. 7 shows a top view of a portion of a substrate after direct wire attach.

DETAILED DESCRIPTION OF THE EMBODIMENTS

Figure 1:
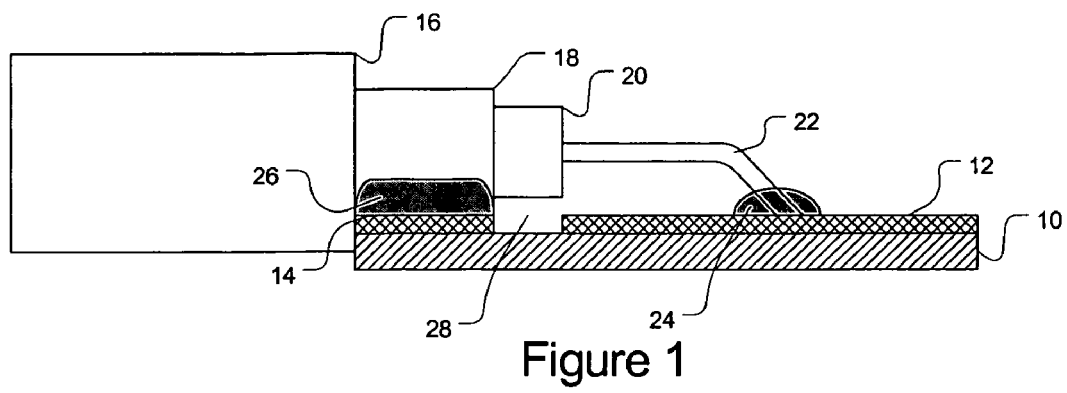
FIG. 1 shows an embodiment of a cable attachment to a printed circuit board trace.

FIG. 1 shows an embodiment of an assembly formed from a coaxial cable and a printed circuit board. The coaxial cable has a jacket 16, shielding 18, a dielectric 20 and a center conductor 22. The printed circuit board 10 has a circuit trace 12 and a ground trace 14 separate by a gap 28. As can be seen in the figure, the coaxial cable is laid down on top of the circuit board and the conductor 22 must be bent to be connected to the circuit trace 12. The conductor and shield are connected to the circuit and ground traces by solder 24 and 26.

The signal path of the conductor 22 and 12 must go through several different environments, each of which may affect a particular signal characteristic. A signal characteristic, as that term is used here, may include such characteristics as impendence, insertion loss, return loss, cross talk, and s-parameters. S-parameters can be defined for any collection of linear electronic components. They are algebraically related to the impedance parameters and to the admittance parameters, and to a notional characteristic impedance of the transmission lines.

The signal path transitions from an environment in which is it shielded by a jacket, the shield and the dielectric, to an environment where it is just surrounded by the shield and the dielectric, to an environment where it is surrounded by the dielectric to an environment where it is surrounded by air. Further, in the environment where the signal path is surrounded only by air, the signal path curves to attach to the trace of the circuit board. It then transitions from the conductor to the trace itself. Generally, the impedance or other signal characteristic is not controlled or managed in any of these transitions, resulting in characteristic mismatches that can degrade signal quality.

Figure 2:
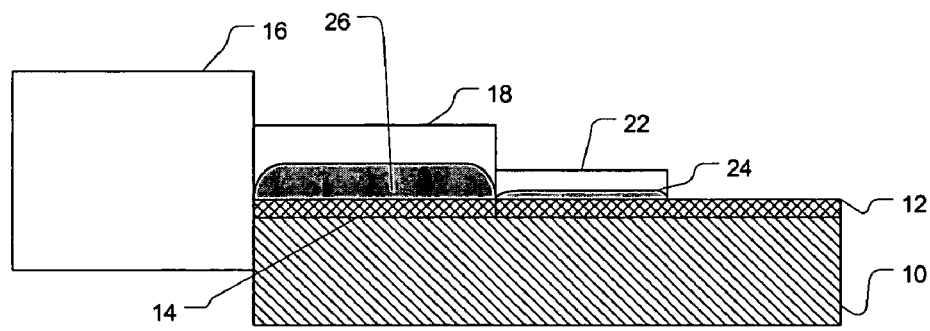
FIG. 2 shows an embodiment of a cable attachment to a substrate trace.

It is possible to control the signal characteristics in these transitions and to manufacture the assembly such that the signal characteristics of the coax cable are minimally affected by transitions in the signal path. A side view of such an assembly is shown in FIG. 2. In FIG. 2, the substrate 10 has upon it a circuit trace 12 and a ground trace 14. In embodiments of this invention, the gap 28 of FIG. 1 does not exist as the bottom of the condutor is planar with the top of the circuit trace. It must be noted that the substrate 10 was referred to as a printed circuit board in FIG. 1, but substrate 10 may be any substrate, including ceramic, dielectric, flex circuitry, etc.

A notch, discussed in more detail later, has been formed in the substrate, such that the coaxial cable can be positioned to control the signal characteristics in the conductor 22. The jacket 16 has been stripped back to expose the shield 18. Further, the shield is electrically coupled and planar with to the ground plane trace 14, in this instance by solder 26. It must be noted that the dielectric shown in FIG. 1 is not exposed in embodiments of this invention because it is trimmed to the length of the shield. Similarly, the conductor 22 has been electrically coupled to the conductive circuit trace 12, in this instance by solder 24, but may be attached in many different ways, such as by electrically conductive paste or any other method of forming electrical connections.

As will be seen in further discussion, each of the transitions is modeled and manufactured with a predetermined characteristic as part of the manufacture. For example, in the assembly of FIG. 2, the impedance may be controlled throughout each transition from jacket, to shield, to solder, to trace, allowing control of a desired level of impedance such as 50 ohms. This alleviates problems with impedance mismatch that can result in degradation of signals.

Figure 3:
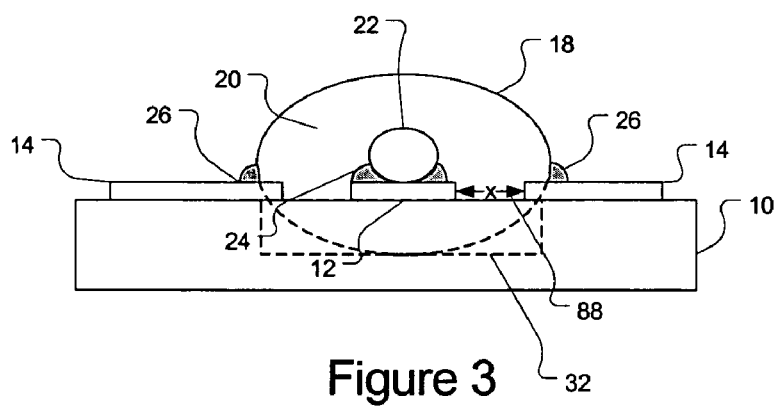
FIG. 3 shows an end view an embodiment of a cable attachment to a substrate trace.

FIG. 3 shows an end view of an assembly similar to that of FIG. 2. A field solver or other such tool may used to model a conductor 22, trace 12 and solder 24 and 26. The resulting conductor model is then used to determine a width x for the gaps, depending upon a particular signal characteristic. Carrying through with the previous signal characteristic of impedance, the width of the gaps may determined based upon a given impedance value, such as 50 ohms. Other typical values may be 60 ohms, 100 ohms or 120 ohms, as examples.

Figure 4:
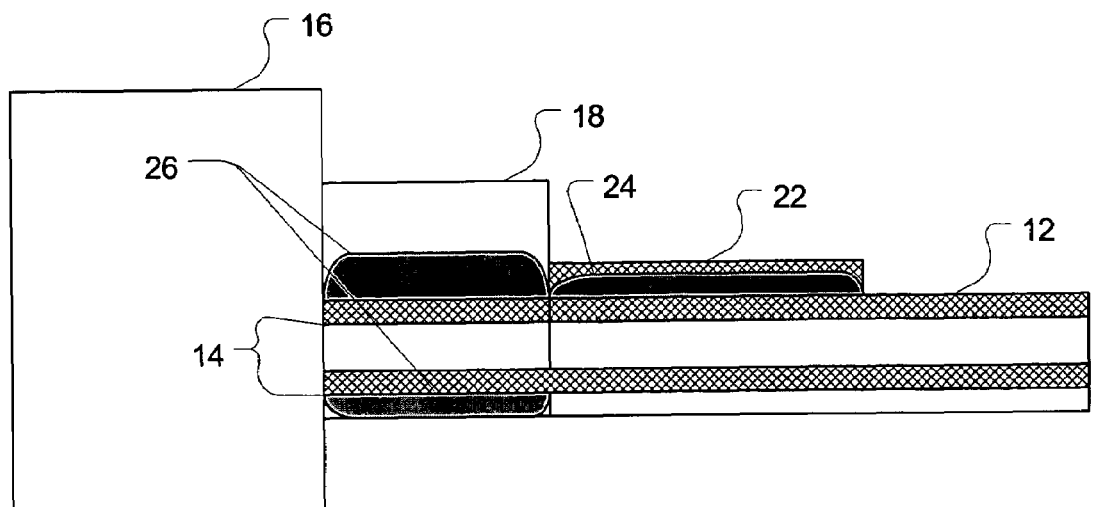
FIG. 4 shows a side view of an alternative embodiment of a cable attachment to a substrate.

One aspect of the assembly that allows this control is the positioning of the cable relative to the substrate. An alternative embodiment of the assembly is shown in FIG. 4, in which the shielding connects to grounds on one or more planes penetrating into the substrate 10. In this embodiment, the conductor 22 is soldered or otherwise joined to the trace 12 by solder 24, but the shield 18 is coupled to the ground planes 14 within the substrate 10. Alternatively, the ground plane 14 may be the bottom layer of the substrate 10.

Figure 5:
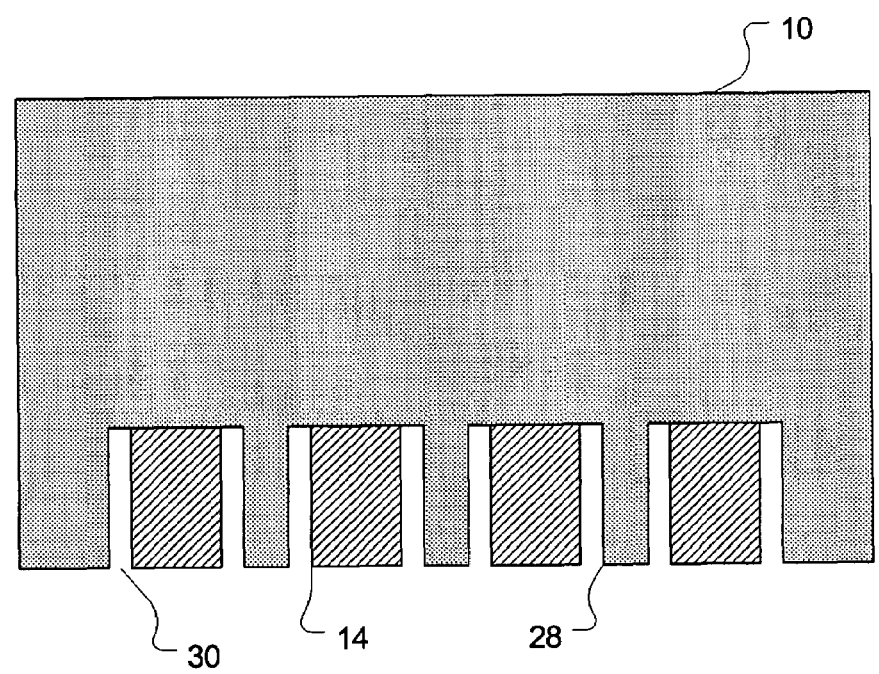
FIG. 5 shows a top view of a substrate.

In order to enable this connection, it may be necessary to remove selected portions of the substrate to expose a ground plane. In one embodiment, shown as a top view in FIG. 5, the other layers 28 of the substrate 10 are removed to expose the ground plane layer 14 in a comb/teeth configuration. The ground plane layer 14 may have tabs formed in it by cutting gaps such as 30 in the ground plane. This allows the tabs to be bent up out of their plane to allow an easier connection to be made to the shielding 18 of FIG. 3, if necessary. These tabs may be formed by laser cutting, among other methods.

FIGS. 6a and 6b show top views of a substrate prepared to receive a conductor such as that shown in FIG. 2. The substrate in the example of FIG. 6a is a 'paddle' board used to then insert into a receptacle attached to another printed circuit board. The substrate 10 has a notch 32 cut into it; a portion of the notch may then be covered with a conductive material. It should be noted that the gaps 34 and 36 have portions 38 and 40 at which the gaps are wider than when surrounding the trace portion 44. Trace portion 44 is a continuation of trace 12 of previous figures. As will be discussed further, the control of these gaps in the transition area contributes to the control of the desired electrical characteristic to meet a targeted value. These gaps form a co-planar waveguide at the termination of the cable adjacent to the cable shield and conductor, such as the co-planar waveguides discussed in U.S. Pat. No. 6,878,901, issued on Apr. 12, 2005, but may transition to a microstrip or other structure in which the signal characteristics are controlled.

The trace 44 traverses the substrate 10 to electrically couple to the paddle finger 42 in the example of FIG. 6a. The goal is to control the characteristic from the edge of the substrate 10 to the paddle finger 42. The configuration of FIG. 6a shows a region in which the conductor will couple to the trace that is of a varying size.

FIG. 6b shows an embodiment in which the fingers are of a uniform width, and the region of the trace to which the conductor will couple is of uniform width. In this instance, the trace on the substrate is engineered to be a constant width line with variable impedance. The impedance is varied by the width of the gaps 34 and 36 at the regions 38 and 40. The variable impedance trace becomes a constant impedance signal path when the center conductor is connected to the trace.

This characteristic may change with the addition of the conductor, as will be discussed further. An embodiment of an assembly using direct wire attach is shown in FIG. 7. The center conductor 22 couples to the trace 12, which cannot be seen as it is covered by the center conductor 22 in this view, such that region 44 of the trace traverses the board. The dielectric 20, shield 18 and jacket 16 partially obscure the portions of the substrate that were seen in FIG. 6a. The shield may be coupled using solder as discussed previously, the solder not shown here to simplify the drawings. The variation in the width of the gaps 34 and 36 widths adjacent the region where the center conductor couples to the trace shown by reference numbers 38 and 40 allows control of the desired electrical characteristic of the signal. An embodiment of a process of manufacturing this and similar assemblies is shown in FIG. 8.

It must be noted that the use of a coax cable is for ease of discussion only. As will be discussed further, application of the embodiments of the invention may be made to twinax cables, as well as many other types of cables that have conductors with and without shielding.

Figure 8:
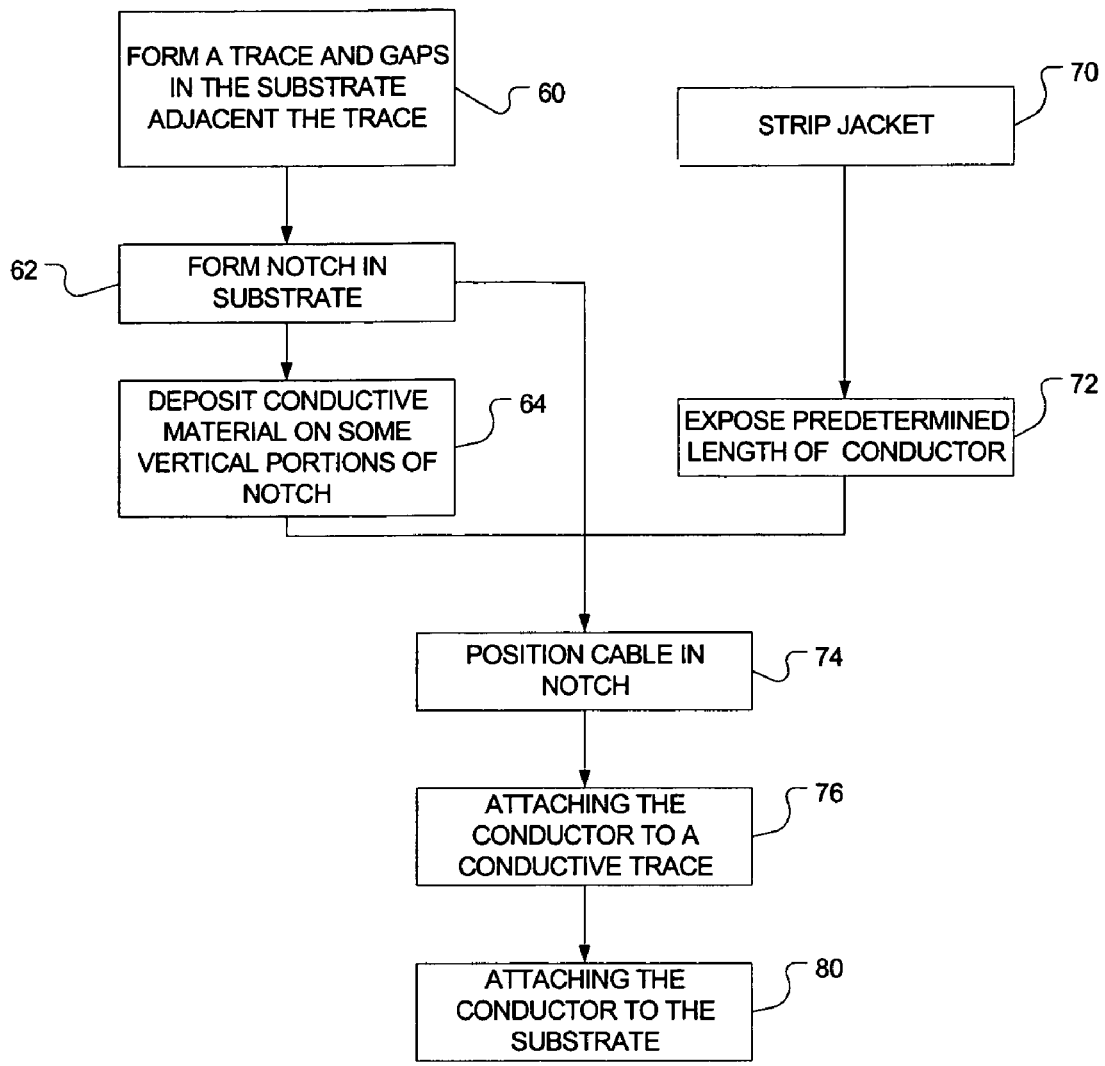
FIG. 8 shows a flowchart of an embodiment of a process of manufacturing a cable connection using direct wire attach.

FIG. 8 shows a flowchart of an embodiment of a method of manufacturing an assembly using direct wire attach. Initially, both the cable and the substrate are prepared. These sub-processes may be performed simultaneously, or serially, with either sub-process being first or second.

At 60, a substrate is prepared by forming traces and gaps adjacent those traces, including controlling the width of the gaps adjacent the region where the conductor and the trace are to couple. For shielded cables, a notch may be formed in the substrate at 62. If a notch is formed, portions of the notch may be covered with a conductive material. For example, vertical portions of the notch may be plated with a conductive material to allow the shield to be electrically coupled to the ground plane or planes of the substrate. This is an optional process and may be unnecessary for cables without shielding.

To prepare the cable, the jacket is generally stripped back at 70 to expose the shield, wherein the length of the shield exposed is based upon the length of the notch and the center conductor is also a predetermined length. At 72, the conductor is exposed of a predetermined length to match the desired electrical characteristic for which the variable impedance line was formed. If the cable does not have shielding, the jacket is merely stripped to expose the conductor. As previously mentioned, the dielectric of the cable is not exposed in embodiments of this invention.

The contacts are then attached at 76 and 78, such as by soldering. While the order shown is to attach the shield and then the conductor, it is possible that these may be done in either order. Further, if the cable has no shielding, then only the center conductor is attached. Other methods of attaching the contacts are of course possible, such as conductive paste, etc.

Figure 9:
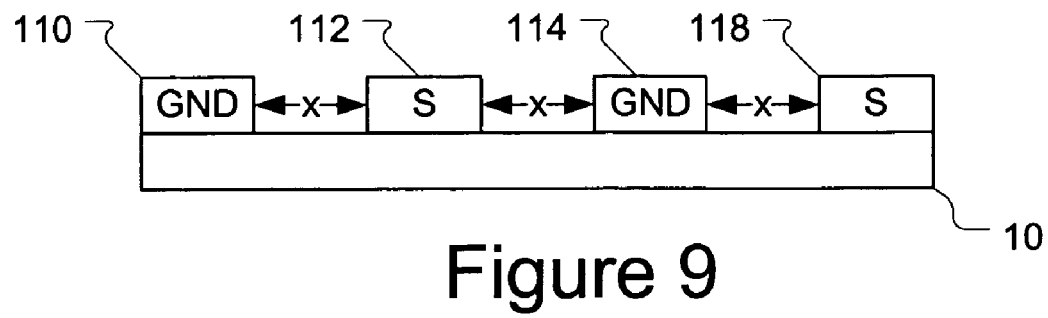
FIGS. 9-11 shows alternative embodiments of direct wire attach configurations for multiple conductors.

In addition to cables having shields or not, embodiments of the invention may be applied to different configurations of conductors, including multiple conductors, differential signaling conductors, etc. FIG. 9 shows an embodiment of multiple, single-ended conductors. In this instance each conductor is surrounded by gaps, between the conductors and ground. Generally, the gap dimension x will be uniform for the different gaps.

Figure 10:
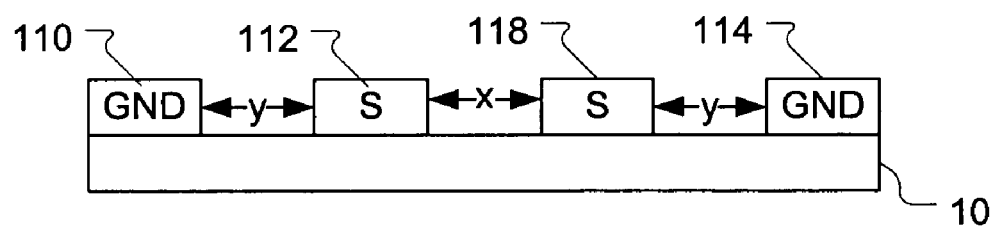
Figure 11:
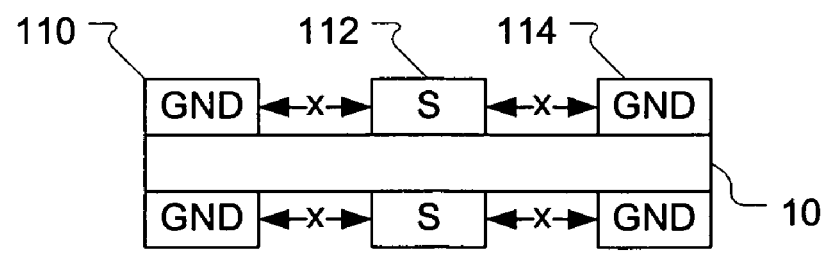

FIG. 10 shows an embodiment of differential signaling conductors, with two gap dimensions. Gap dimension y is used for common mode between the conductors and ground, and gap dimension x is between the differential signal conductors. The control of these dimensions in turn controls the signal path to match the desired electrical characteristic.

Similarly, differential signaling could be configured on either side of the substrate 10. In this case, the gaps are controlled between each signal trace and its dual ground references, such as between signal trace 112 and the ground traces 110 and 114. This allows for differential signaling to be configured in this manner, yet still be controlled for a particular signal characteristic.

Thus, although there has been described to this point a particular embodiment for a method and apparatus for controlling signal characteristics through transitions in an assembly, it is not intended that such specific references be considered as limitations upon the scope of this invention except in-so-far as set forth in the following claims.

What is claimed is:

1. An assembly, comprising:
  a conductive trace on surface of a substrate, the substrate having a ground plane;
  a structure external to the substrate having at least one conductor with at least one shield;
  the conductor electrically coupled to and arranged upon the trace;
  the shield electrically coupled to and planar with the ground plane; and
  first and second gaps arranged such that one gap is on either side of trace on the surface of the substrate, wherein a width of the gaps is based upon a selected signal characteristic and the gaps have varying widths in a region adjacent an area in which the conductor is electrically coupled to the trace.

2. The assembly of claim 1, wherein the substrate further comprises a printed circuit board.

3. The assembly of claim 1, the assembly further comprising a notch in a side of the substrate having at least a portion covered with a conductive material.

4. The assembly of claim 1, wherein the conductive trace is further electrically coupled to a plug finger connector on the substrate.

5. The assembly of claim 1, wherein the selected signal characteristic is one or more selected from the group consisting of: impedance, insertion loss, return loss, cross talk and s-parameters.

6. The assembly of claim 1, wherein the conductor further comprises a center conductor of a coaxial cable.

7. The assembly of claim 6, wherein the coaxial cable further includes the shield that is electrically coupled to the ground plane on the substrate.

8. The assembly of claim 7, wherein the shield is electrically coupled to the ground plane at the surface of the substrate.

9. The assembly of claim 7, wherein the shield is electrically coupled to the ground plane at an interior layer of the substrate.

10. The assembly of claim 7, wherein the shield is electrically coupled to the ground plane at a bottom layer of the substrate.

11. The assembly of claim 7, wherein the ground plane at an interior layer further comprises at least one tab formed in the interior layer, wherein the tab is electrically coupled to the shield.

12. The assembly of claim 1, wherein the conductor further comprises more than one conductor.

13. A method of manufacturing a cable assembly, comprising:
    forming a trace on a surface of a substrate and forming gaps in the surface of the substrate on either side of the trace, the gaps having varying widths in a first region adjacent to where the conductor is attached to the trace, and having constant widths in a second region on a side of the first region away from an edge of the substrate;
    stripping a jacket on a cable external to a substrate to expose a conductor and a shield;
    placing the cable against the substrate such that the conductor is arranged upon the trace and the shield contacts a ground plane in the substrate; and
    attaching the conductor to the trace and the shield to the ground plane.

14. The method of claim 13, the method further comprising forming a notch in the substrate.

15. The method of claim 14, wherein the notch further comprises a notch having conductive material covering at least a portion of the notch.

16. The method of claim 13, wherein stripping a jacket further comprises stripping the jacket to expose a shield of a coaxial cable and to expose a center conductor.

17. The method of claim 13, wherein stripping a jacket further comprises stripping the jacket of a twinax cable to expose two conductors.

18. The method of claim 13, wherein forming gaps further comprises using a laser to cut gaps in the substrate.

19. The method of claim 13, wherein attaching the conductor to the substrate further comprises soldering the conductor to the conductive trace and soldering the shield to the ground plane.

* * * * *